United States Patent [19]

Gerstenberg et al.

[11] Patent Number: 4,945,323
[45] Date of Patent: Jul. 31, 1990

[54] FILTER ARRANGEMENT

[76] Inventors: Bruno Gerstenberg, Muhlenstr. 9, 7776 Owingen; Hans J. Michling, Obertorstr. 14A; Josef Vachek, Fichtenweg 3, both of 7770 Uberlingen, all of Fed. Rep. of Germany

[21] Appl. No.: 378,147

[22] Filed: Jul. 11, 1989

[30] Foreign Application Priority Data

Jul. 11, 1988 [DE] Fed. Rep. of Germany ....... 3823469

[51] Int. Cl.$^5$ .......................... H03H 7/00; H05K 3/46; H05K 9/00
[52] U.S. Cl. ..................................... 333/185; 333/12; 361/401; 361/414; 174/262
[58] Field of Search ............... 333/185, 182, 183, 184, 333/12; 361/302, 400, 401, 412, 414, 415; 174/262, 260, 255, 258

[56] References Cited

U.S. PATENT DOCUMENTS

| 3,916,514 | 11/1975 | Salminen | 361/414 |
| 4,620,264 | 10/1986 | Ushifusa et al. | 361/414 |
| 4,821,142 | 4/1989 | Ushifusa et al. | 361/414 X |

FOREIGN PATENT DOCUMENTS

| 0181286 | 5/1986 | European Pat. Off. |
| 0264105 | 4/1988 | European Pat. Off. |
| 0162146 | 5/1988 | European Pat. Off. |
| 214062 | 7/1941 | Fed. Rep. of Germany |
| 1590690 | 1/1970 | Fed. Rep. of Germany |
| 7729132 | 2/1978 | Fed. Rep. of Germany |
| 8309875 | 1/1984 | Fed. Rep. of Germany |
| 3426278 | 1/1986 | Fed. Rep. of Germany |
| 239916 | 10/1986 | German Democratic Rep. |

OTHER PUBLICATIONS

"Surface Mounted Printed Wire Board Jumper for Unused Integrated Circuit Input Pins", IBM Tech. Dis. Bull., vol. 31, No. 3, Aug. 1988, pp. 496-497.

Primary Examiner—Eugene R. LaRoche
Assistant Examiner—Seung Ham
Attorney, Agent, or Firm—Lee, Mann, Smith, McWilliams & Sweeney

[57] ABSTRACT

A filter arrangement is described for filtering a plurality of conductors which are guided from a space comprising electromagnetic fields through a separating wall to a device located in a shielded space, in which the separating wall (24) is formed by a multilayer printed circuit card (86). The printed circuit card (86) comprises a continuous internal instrument ground (32). The instrument ground (32) has as signal passage means narrow apertures (102) through which feed-through conductors (108) are passed at a short distance from the edges of the apertures (102). Electrically conductive surfaces (104,106) on the layers (94,96) adjacent to the instrument ground (32) form filter capacitors with the instrument ground (32). The surfaces (104,106) are connected to the feed-through conductors (108). Filter components (62,64,70,80,82) are formed as SMD-components and mounted on the printed circuit card (26). The instrument ground (32) is guided outwards at the edges of the printed circuit card (26) and the edges of the printed circuit card (26) are copper-coated and connected to the housing (10) in a well-conductive way.

6 Claims, 2 Drawing Sheets

FILTER ARRANGEMENT

TECHNICAL FIELD

The invention relates to a filter arrangement for filtering a plurality of conductors which are guided from a space comprising electromagnetic fields to a device located in a shielded space, comprising
  (a) a separating wall (24) in the form of a multilayer printed circuit card (26) provided with an internal instrument ground (32) and having filter members, and
  (b) holes, through which signal conductors are passed through, are provided in the printed circuit card for passing signals through.

BACKGROUND ART

Sensitive electronic devices, such as flight or engine control computers of aircraft, are accommodated in a space shielded against electromagnetic fields. Conductors are guided to these devices, which conductors come from a space in which strong electrical or magnetic fields of high frequency may occur. The conductors conduct wanted signals. These wanted signals may be analog signals as well as digital impulse sequences. Interfering electromagnetic fields may reach the shielded space through these conductors. Signals which are superimposed over the wanted signals and which drive signal processing into saturation and "clog" the signal processing, may be induced in the conductors. For this reason, filters are provided at the separating wall by which filters such interferences, which may have frequencies up to the range of gigahertz, are eliminated. Therefore, it is known to provide apertures in the shielding separating wall, with one aperture for each conductor. Passage capacitors are located in these apertures. The passage capacitors are soldered or screwed into the separating wall (DE-U-No. 77 29 132, DE-A-No. 1 590 690). With this known method problems arise:

With small devices having a multitude of conductors the separating wall with the multitude of passage filters and plugs is of considerable weight. Passage capacitors having the required capacity values are expensive. Furthermore, supplementary wiring from the entrance plug to the filters, as well as from the filters to the portions of the device arranged in the shielded space is required. Such wiring must be manufactured manually, involving considerable expense.

EP-No. A1-0 181 286 shows a shielded arrangement for interference protection of communication conductors. A double-layer, two-sided printed-board assembly is inserted between an entrance space and an exit space of an interference protection assembly shielded by a bottom and a cover. The printed circuit card comprises instrument ground between the layers. An interference-suppressing network having bleeding resistors, capacitors and coils is provided between input conductors, output conductors and instrument ground. These components are solded, welded or conductingly bonded on or in the printed circuit card.

In this known arrangement, the instrument ground exists only incompletely. The interference-suppressing network is formed by separated components located on the printed circuit card. The incomplete formation of the instrument ground does not offer any protection against extreme high-frequency interference such as those which occur in the range of gigahertz. Also, the interference-suppressing network constructed of separated components loses its filter effect in this high frequency range DE-No. A1-34 26 278 shows a through plating of a multilayer printed circuit card. The printed circuit card is provided with a shield foil between the layers and a passage hole. The passage hole has a metal lining. The lining is electrically connected to the shield foil. The lining carries an insulating layer on which, in turn, a conductive metal layer is located.

This shielding shall serve to decouple the through plating with respect to adjacent throughplatings. Thus, this printed publication does not relate to the shielding of a space against electromagnetic fields of high frequency. It is true that the lining with the insulating layer and the outer metal layer represents a capacitor, one plate of which, the metal layer, is conductively connected to the shield foil. However, the capacity of a capacitor constructed in such a way is, assuming customary dimensions, too small to permit the shielding of a space against the previously mentioned electromagnetic fields.

CH-A-No. 214 062 shows a passage of a conductor through a shielding wall shielding against high-frequency waves. At the site of the passage, both sides of a metal wall are provided with insulating coatings. The insulating coatings are pressed by metal washers against the metal wall. The washers form capacitors together with the metal wall. The bolts serve as passages.

For each through-going conductor capacitors must be assembled from individual parts which is very expensive in terms of manufacturing engineering.

DD-No. A1-239 916 shows a high-frequency tight assembly having switching circuits mounted on the surface on a multilayer printed circuit card The printed circuit card comprises a "shielding support" in a conductive plane. This shielding support is connected through contact pins to shielding caps covering and shielding the switching circuits. This does not refer to the passage of signal conductors through a shielding separating wall between a space with high-frequency electromagnetic fields and a space which should be protected against such fields.

EP-No. B1-0 162 146 shows a shielded cabinet in which filter assemblies are inserted into a mounting wall. DE-No. U1-83 09 875.5 relates to a printed circuit plate having partially parallel strip conductors, a ground conductor being arranged between these strip conductors for their capacitive decoupling. E-No. A2-0 264 105 relates to a method for manufacturing multilayer printed circuit cards in which at least one layer is formed by a metal plate.

DISCLOSURE OF INVENTION

It is the object of the invention to provide a filter arrangement of the above-mentioned type such that it allows, at a relatively low cost and with reduced weight as compared to the prior art, the passage of a large number of conductors through a shielding separating wall, and the filtering out of interferences up to very high frequencies.

According to the invention this object is achieved in that
  (c) the instrument ground is formed by a continuous surface except for narrow apertures in the area of the holes through which feed-through conductors are passed, and (d) in addition to the internal instrument ground, additional layers having conductive surfaces are provided in the multilayer printed circuit card which conductive surfaces form with the electrically connected signal conductor, filter members preventing passage of high-frequency electromagnetic waves through the holes.

Thus, a multilayer printed circuit card having an internal instrument ground is used as a separating wall. A feed-through conductor is passed through this instrument ground at a short distance from it. The aperture is so narrow that no interference fields reach the shielded space therethrough.

The conductive surfaces on said additional layers of the multilayer printed circuit card form filter members preventing high-frequency fields from passing directly through the holes. These conductive surfaces also form, with the instrument ground, capacitors through which high-frequency signals are directed towards the ground.

To this end, with holes extending directly through, the electrically conductive surfaces of the additional layers form capacitors between signal conductor and instrument ground.

The holes may also be formed by narrow blind bores extending from one side of each printed circuit card through the layers of the printed circuit card to one of the conductive surfaces provided at each of the said additional layers, more bores may be provided in the printed circuit card which extend between the conductive surfaces at the additional layers and which are laterally offset to the associated blind bores, and feed-through conductors in the blind bores and in said additional layers may be passed through the apertures and electrically connected to said conductive surfaces. Thus, a "detour" is provided for the high-frequency fields. On this detour the high-frequency fields are dampened. The conductive surfaces of the additional layers here also form capacitors with the instrument ground, through which the high frequency fields are directed towards the ground.

Furthermore, filter components may be formed as SMD-components (surface mounted device) and mounted on the printed circuit card.

Filter components may be arranged on the side of the space comprising electromagnetic fields as well as on the side of the shielded space.

The instrument ground may be guided outwards at the edges of the printed circuit card and connected to an electrically conductive contact extending around the printed circuit card, and the contact extending around the printed circuit card may be connected at its entire circumference to a shielding housing in an electrically well-conductive way.

An embodiment of the invention will now be described in greater detail with reference to the accompanying drawings.

BEST MODE OF CARRYING OUT THE INVENTION

Figure 1:
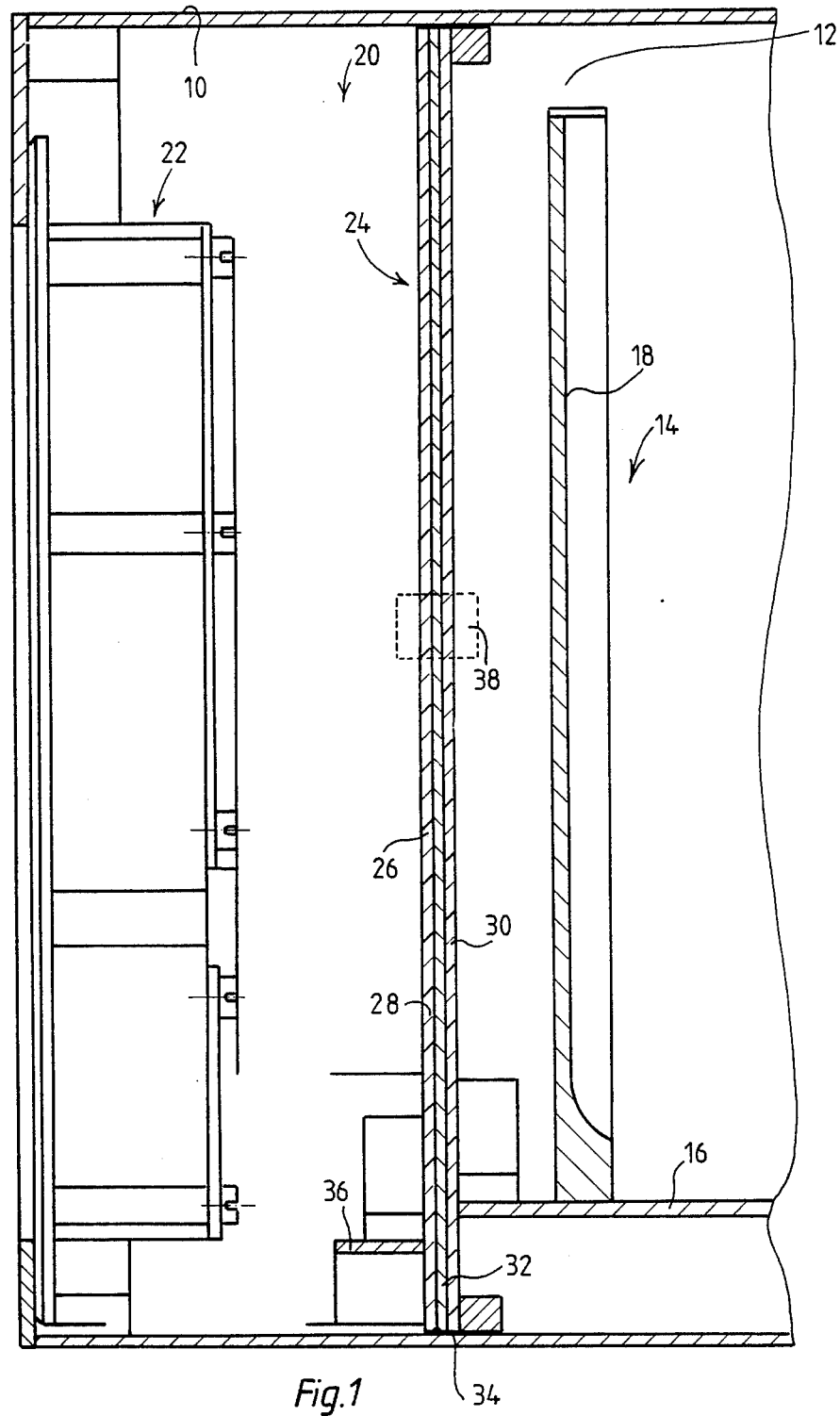
FIG. 1 shows a partial sectional view of a device the components of which are arranged in a shielded space separated from an external space comprising electromagnetic fields by a shielding separating wall through which a multitude of conductors is passed to the device, filtering being achieved by means of filters provided at the separating wall.

A housing is designated by 10. The housing 10 encloses a space 12 shielded against electromagnetic fields. An electronic device 14, such as a computer, is arranged in the space 12. In FIG. 1 a motherboard 16 and a printed circuit card 18 of the device 14 are illustrated. A non-shielded space 20, in which electromagnetic fields—possibly of considerable intensity—may occur, is located outside the shielded space. A connector socket 22 is provided at the front side of the housing 10, through which connector socket a multitude of (not illustrated) signal conductors are connectable. A shielding separating wall 24 is provided between the connector socket 22 and the shielding space 12. The separating wall 24 permits passage of the different conductors from the non-shielded space 20 into the shielded space 12 and to the device 14. In addition, a filtering process is carried out for eliminating interference signals caused by outer electromagnetic fields. The separating wall 24 is formed by a multilayer printed circuit card 26. The printed circuit card 26 comprises insulating layers 28, 30 and a continuous ground layer 32 located inbetween and made of well-conductive material. The ground plane 32 is guided out at the edges of the printed circuit card 26, as indicated at 34, and forms a contact well-conductively connected to the housing 10. The individual conductors are guided onto the outer side of the printed circuit card 26 to a contact ledge 36 and connected through a flexible multiple lead cable (Wirewrap or Flex Lead) to the connector socket 22. On the side of the shielded space 12 the conductors on the inner side of the printed circuit card 26 are guided to the motherboard 16 of the device. Filter components 38 are located on the printed circuit card 26. These filter components 38 are formed as SMD-components (surface mounted devices).

Figure 2:
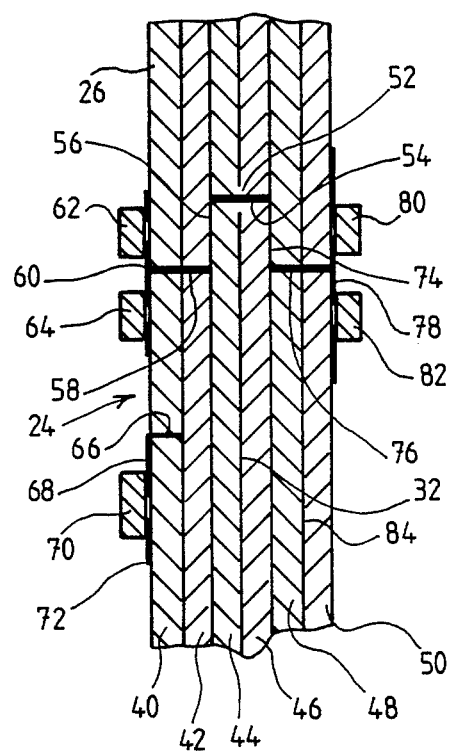
FIG. 2 shows a detail A of FIG. 1 on an enlarged scale.

In FIG. 2 the construction of the separating wall 24 with the printed circuit card 26 and the filter components and conductors for one conductor are illustrated on an enlarged scale.

The multilayer, filter card comprises six layers 40,42,44,46,48 and 50 in all. The layers 40,42,44 form the insulating layer 28 of FIG. 1. The layers 46, 48 and 50 form the insulating layer 30 of FIG. 1. The instrument ground 32 extends between the layers 44 and 46 over the whole surface of the printed circuit card 26.

The instrument ground 32 has a narrow aperture 52. A feed-through conductor extends through this aperture 52 perpendicularly to the plane of the printed circuit card 26. The feed-through conductor 54 extends through the thickness of the insulating layers 44 and 46. A strip conductor 56 is formed on the left side of the layer 44 in FIG. 2. This strip conductor 56 extends up to a feed-through conductor 58. The feed-through conductor 58 extends through both layers 40 and 42 and is connected to a strip conductor 60 on the left outer side of the layer 40. This strip conductor 60 establishes the contact to the capacitors 62 and 64 formed as SMD-components and mounted on the printed circuit card 26. On the right side of the layer 40 in FIG. 2, a strip conductor is formed, which is also in electrically conductive contact with the feed-through conductor 58 and guided to a feed-through conductor 66. The feed-through conductor 66 extends through the layer 40 outwards and is in electrically conductive connection with a strip conductor 68. The strip conductor 68 is connected to a strip conductor 72 through an inductor 70. The inductor is also formed as SMD-component and mounted on the printed circuit card 26. The strip conductor 72 forms a part of the supplying conductor. The strip conductor 72 is thus guided downwards in FIG. 1 to the contact ledge 36 and connected through the flexible cable to a contact of the connector socket 22. The components 62, 64 and 70 thus form a filter on the outer side of the printed circuit card 26, i.e. in the area of the space 20 in which electromagnetic interference fields may occur.

Similarly, a strip conductor 74 on the left side of the layer 48 in FIG. 2 is electrically conductively connected to the feed-through conductor 52 and a feed-through conductor 76. The feed-through conductor 76 extends through the layers 48 and 50. A strip conductor 78 is formed on the outer side of the layer 50 at the right in FIG. 2. The strip conductor 78 is connected to the feed-through conductor 76 as well as to capacitors 80 and 82. The capacitors 80 and 82 are formed as SMD-components and mounted on the right surface of the printed circuit card 26 in FIG. 2. The capacitors 80 and 82 form part of a filter arranged on the printed circuit card 26 on the side of the shielded space 12. A strip conductor 84 is formed on the left surface of the layer 50. The strip conductor 84 is also in electrically conductive connection with the feed-through conductor 76. The strip conductor 84 forms a part of the conductor passed through the separating wall 24 and is guided downwards in FIG. 1 to the motherboard 16.

Figure 3:
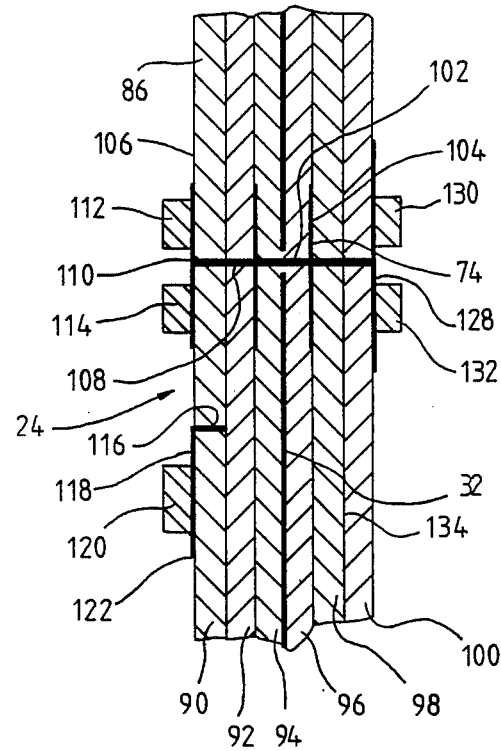
FIG. 3 shows in a sectional view similar to FIG. 2 a modified embodiment of a filter arrangement having a feed-through conductor extending straight through and capacitor plates formed by additional layers of the printed circuit card.

In the embodiment of the separating wall of FIG. 3, the printed circuit card is designated by 86.

The multilayer printed circuit card 86 has also six layers 90,92,94,96,98 and 100. Again, the layers 90,92,94 form the insulating layer 30 of FIG. 1. The instrument ground 32 extends between the layers 94 and 96 over the whole surface of the printed circuit card.

The instrument ground 32 has a narrow aperture 102. A feed-through conductor 108 extends through this aperture 102 perpendicularly to the plane of the printed circuit card 86. The feed-through conductor 108 extends here directly through the thickness of the printed circuit card 86. The feed-through conductor 108 is connected to a strip conductor 110 on the left outer side of the layer. This strip conductor 110 establishes the contact to capacitors 112 and 114. The capacitors 112 and 114 are formed as SMD-components and mounted on the printed circuit card 86. This is similar to the embodiment of FIG. 2. On the right side of the layer 40 in FIG. 3, a strip conductor is formed, which is also in electrically conductive contact with the feed-through conductor 108 and guided to a feed-through conductor 116. The feed-through conductor 116 extends through the layer 90 outwards and is in electrically conductive connection with a strip conductor 118. The strip conductor 118 is connected to a strip conductor 122 through an inductor 120. The inductor 120 is also formed as SMD-component, i.e. as surface mounted device, and mounted on the printed circuit card 86. The strip conductor 122 again forms a part of the supplying conductor, similar to strip conductor 72 in FIG. 2. Also herein, the components 112, 114, and 120 form a filter on the outer side of the printed circuit card 86, i.e. in the area of the space 20 in which electromagnetic interference field may occur.

Similarly, a strip conductor 128 on the right side of the layer 100 is electrically conductively connected to the feed-through conductor 108. The strip conductor 128 is further connected to capacitors 130 and 132. The capacitors 130 and 132 are formed as SMD-components and mounted on the right surface of the printed circuit card 86 in FIG. 3. The capacitors 130, 132 form a part of a filter arranged on the printed circuit card 86 on the side of the shielded space 12. A strip conductor 134 is formed on the left surface of the layer 100. The strip conductor 134 is also in electrically conductive connection with the feed-through conductor 108. The strip conductor forms a part of the conductor passed through the separating wall 24 and is guided downwards in FIG. 1 to the motherboard 16.

The feed-through conductor 108 is electrically connected to a conductive surface 106 between the layers 92 and 94. This conductive surface forms a plate of a capacitor. The other plate of the capacitor is represented by the instrument ground 32. High-frequency fields are directed through this capacitor towards the instrument ground 32. The high-frequency fields cannot simply pass along the feed-through conductor 108 through the aperture 102 directly to the shielded space. Rather, the fields are forced by the electrically conductive surfaces, similarly as in the embodiment of FIG. 2, to "detour" around the electrically conductive surface 106.

Similarly, the feed-through conductor 108 is electrically connected to a conductive surface 104 between the layers 92 and 94. This conductive surface 104 also forms a plate of a capacitor. The other plate of the capacitor is again represented by the instrument ground 32. High-frequency fields are also directed through this capacitor towards the instrument ground 32. Also herein, the high-frequency fields are forced by the electrically conductive surfaces, to "detour" around the electrically conductive surface 104.

The filters formed by the components 112, 114, 120 and 130, 132, respectively, mounted on the surface of the printed circuit card 86, are effective at relatively "low" frequencies of the interfering high-frequency fields. With frequencies from about 1 to 10 gigahertz, these filters are no longer effective. The "transmission curve" would increase again. At these frequencies, however, the capacitors formed by the electrically conductive surfaces 104 and 106 together with the instrument ground, act as filter.

These capacitors may be manufactured using the conventional technology of the printed circuits for practically all the desired executions. The manufacture of such separating walls is thus relatively simple compared to the prior art.

We claim:

1. Filter arrangement for filtering a plurality of conductors which are guided from a space comprising electromagnetic fields to a device located in a shielded space, comprising (a) a separating wall (24) in the form of a multilayer printed circuit card (26) provided with an internal instrument ground (32) and having filter members, and (b) holes, through which signal conductors are passed through, are provided in the printed circuit card for passing signals through, characterized in that (c) the instrument ground is formed by a continuous surface except for narrow apertures in the area of the holes through which feed-through conductors are passed, and (d) in addition to the internal instrument ground, additional layers having conductive surfaces are provided in the multilayer printed circuit card which conductive surfaces form with the electrically connected signal conductor, filter members preventing passage of high-frequency electromagnetic waves through the holes.

2. Filter arrangement as set forth in claim 1, characterized in that, with holes extending straight through the electrically conductive surfaces of the additional layers, form capacitors between the signal conductor and instrument ground.

3. Filter arrangement as set forth in claim 1, characterized in that (a) the holes are formed by narrow blind bores extending from each side of the printed circuit card through the layers of the printed circuit card to one of the conductive surfaces provided at each said additional layer, (b) further bores are provided in the printed circuit card which extend between the conductive surfaces of the additional layers and which are laterally offset to the associated blind bores, and (c) feed-through conductors in the blind bores and in said additional layers are passed through the apertures and are electrically connected to said conductive surfaces.

4. Filter arrangement as set forth in claim 1, characterized in that filter components (62,64,70,80,82) are formed as SMD-components (surface mounted device) and mounted on the printed circuit card (26).

5. Filter arrangement as set forth in claim 1, characterized in that filter components (62,64,70 and 80,82, respectively) are arranged on the side of the space (20) comprising electromagnetic fields as well as on the side of the shielded space (12).

6. Filter arrangement as set forth in claims 1, characterized in that (a) the instrument ground is guided outwards at the edges of the printed circuit card and is connected to an electrically conducting contact extending around the printed circuit card, and (b) the contact extending around the printed circuit card is connected at its entire circumference to a shielding housing in a electrically well-conductive way.

* * * * *